United States Patent [19]

Bejczy

[11] 4,405,197
[45] Sep. 20, 1983

[54] OPTICAL FIBER TACTILE SENSOR

[75] Inventor: Antal K. Bejczy, Pasadena, Calif.

[73] Assignee: The United States of America as represented by the Administrator of the National Aeronautics and Space Administration, Washington, D.C.

[21] Appl. No.: 210,405

[22] Filed: Nov. 25, 1980

[51] Int. Cl.³ .......................... G02B 5/14; A61F 1/00
[52] U.S. Cl. ..................................... 350/96.15; 3/1.1;
73/432 T; 250/227; 350/96.10
[58] Field of Search ............... 350/96.10, 96.15, 96.16,
350/96.20; 250/227; 3/12, 12.8, 1.1; 73/716,
432 T

[56] References Cited

U.S. PATENT DOCUMENTS

| 3,374,762 | 3/1968 | Baldwin | 3/12 X |
| 3,509,583 | 5/1970 | Fraioli | 3/1.1 |
| 3,751,733 | 8/1973 | Fletcher et al. | 3/1.1 |
| 3,786,238 | 1/1974 | Heisner | 250/227 X |
| 3,937,952 | 2/1976 | Ripley et al. | 250/227 |
| 4,249,076 | 2/1981 | Bergström et al. | 250/227 |
| 4,254,333 | 3/1981 | Bergström | 250/227 X |
| 4,329,581 | 5/1982 | Helfrich, Jr. et al. | 250/227 X |

OTHER PUBLICATIONS

Sharp et al., "Optical Keyboard," *IBM Tech. Discl. Bull.*, vol. 5, No. 10, Mar. 1963, p. 127.
Uberbacher, "Fiber Optic Illuminated Switch," *IBM Tech. Discl. Bull.*, vol. 18, No. 2, Jul. 1975, p. 483.
Cummings, "Transparent Keyless Keyboard for Variable Terminal Applications," *IBM Tech. Discl. Bull.*, vol. 20, No. 4, Sep. 1977, pp. 1609-1611.

*Primary Examiner*—John D. Lee
*Attorney, Agent, or Firm*—John R. Manning; Paul F. McCaul; Thomas H. Jones

[57] ABSTRACT

A tactile sensor comprises an array of cells which are covered by an elastic membrane, having an exposed surface which is adapted to come in contact with an object. Light is conducted to each cell from a light source by an optical fiber which terminates at the cell. Reflected light from the cell is conducted by an optical fiber to a light processor, which senses changes in the light received thereby from an ambient level whenever an object comes in contact with the membrane surface above the cell.

3 Claims, 9 Drawing Figures

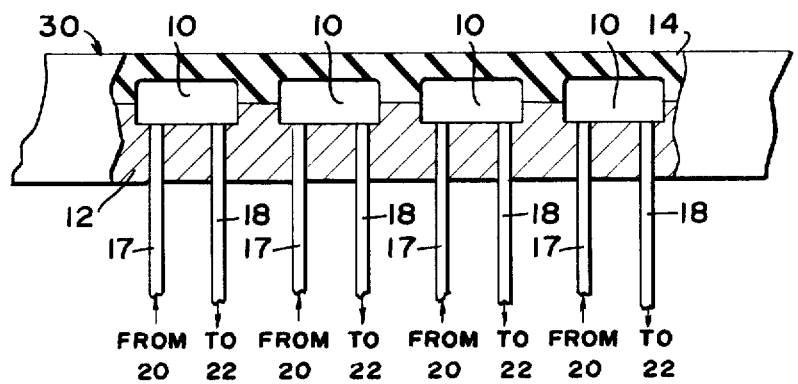
FIG. 2
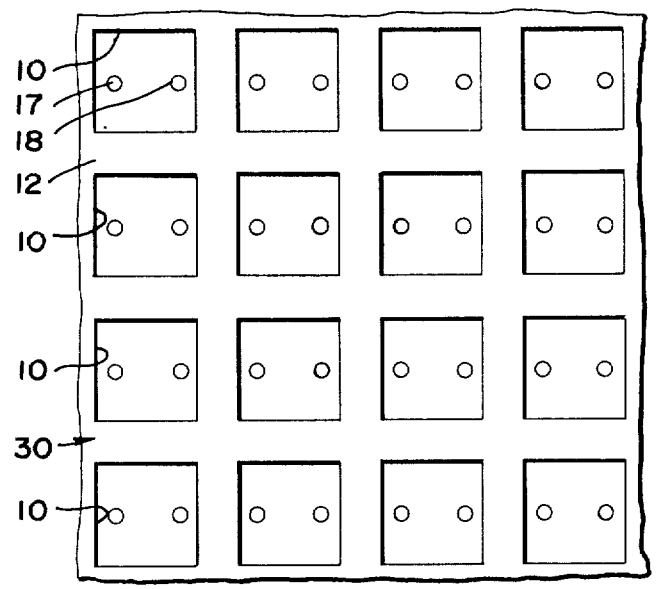
FIG. 3
FIG. 5

OPTICAL FIBER TACTILE SENSOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 USC 2457).

BACKGROUND OF THE INVENTION

1. Field of the Invention

The present invention generally relates to fiber optics devices and, more particularly, to fiber optics tactile sensors.

2. Description of the Prior Art

Quite often it is desirable or necessary to sense the contact between objects. For example when operating a mechanical hand it is often important to determine when the hand grips or contacts a target object. The force with which the hand grips the object is also of importance in certain cases.

Visual techniques alone are inadequate to provide such information. Quite often the hand itself blocks any visual path, even for television cameras. Electrical tactile sensors on the hand are also unsatisfactory since they are subject to induced spurious signals, especially when long leads are required from the hand to the operator's location. Strong magnetic fields, which may be present, induce noise and spurious signals. Also, long parallel sensor leads induce crosstalk between channels. The motion of the hand itself induces noise. All these factors tend to obscure small sensor signals, which are present at the time of initial contact, when the forces between the hand and the object are very small. Various techniques have been attempted to overcome these problems. They have been found to be costly, bulky and of limited reliability. Similar problems exist when a tactile sensor which has to be used with other than mechanical hands is remotely located from the operator's or signal processing location. A need therefore exists for a new tactile sensor, which will greatly reduce, if not completely eliminate, the above-discussed disadvantages of prior art sensors.

SUMMARY OF THE INVENTION

In accordance with the present invention a tactile sensor comprising an array of cells, faced with a flexible elastic membrane which is subject to distortion due to tactile pressure, is provided. Light is brought to each of the cells by optical fibers and light, which is reflected in each cell, is guided by optical fibers to detectors. As the membrane comes in contact with an object it becomes distorted, thereby distorting the membrane surfaces within the cells. The distortions of the membrane surfaces in the cells change the amount of light which is reflected from these cells. Since the extent of distortion of the membrane is related to the pressure forces applied thereto, and since the extent of distortion affects the amount of reflected light from the cells, by detecting the changes in reflected light from the cells from a known level, one can determine the time of contact of an object with the membrane and the pressure forces applied to the membrane. By sensing any changes in reflected light one can determine the contact of any object with the membrane.

BRIEF DESCRIPTION OF THE DRAWINGS

FIG. 2 is a simplified side and cross-sectional view of a mechanical hand employing the invention;

FIG. 3 is a top view of a cell array;

FIG. 5 is a top view of a keyboard in accordance with the present invention;

DETAILED DESCRIPTION OF THE INVENTION

Figure 1A:
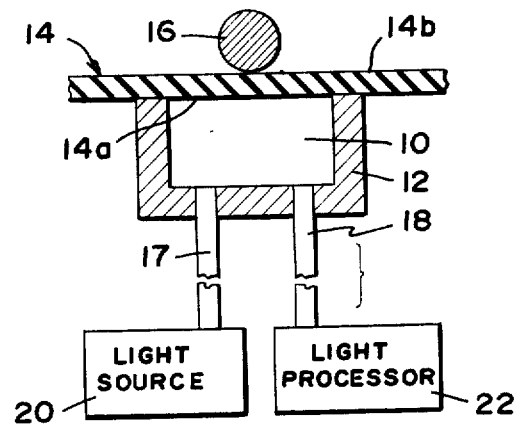
FIGS. 1A, 1B and 1C are combination block and cross-sectional diagrams, useful in explaining the basic principles of the invention.

The basic principle of the present invention may best be explained in connection with FIGS. 1A, 1B and 1C, wherein like elements are designated by like numerals. In accordance with the present invention the novel tactile sensor consists of cells one of which is shown in FIG. 1A, and is designated by numeral 10. The cell is formed as an open cavity in a solid material 12. The cell is closed off by an elastic membrane 14. The inner surface 14a of the membrane forms the top side of the cell, and its opposite surface 14b is exposed, so as to come in contact with a target object 16. A pair of light conductors 17 and 18 extend through material 12 and terminate at the bottom side of the cell, opposite surface 14a.

Various types of light conductors may be used. However, since in the following description, applications will be described in which it is preferred to use optical fibers as the light conductors, hereinafter the light conductors will be referred to as optical fibers or simply fibers.

As shown in FIG. 1A, fiber 17 is shown connected to a light source 20. The latter acts as a source of light which is conducted to the cell 10 by fiber 17. The function of fiber 18 is to conduct light from the cell to a light processor 22. The light, which fiber 18 conducts to the processor, consists of some of the light which entered the cell 10 and is reflected to fiber 18. Preferably, the cell's sides, formed by the solid material 12, are coated with nonreflective matter and the surface 14a of membrane 14 by reflective matter, so that surface 14a is primarily responsible for the reflection of the light in the cell to fiber 18.

Assuming a constant amount of light entering the cell via fiber 17, the amount of light which gets reflected to fiber 18 depends on the shape of surface 14a and its distance from the opposite cell side i.e. the cell's depth. In the absence of any force, applied to outer side 14b of membrane 14, the surface 14a is flat and the height of the cell is its originally designed height. Under such condition a determinable amount of light is conducted by fiber 18 to processor 22. The latter which may contact any known light-sensitive devices e.g. photodiodes, photo-transistors etc. is designed to provide an output signal, analog and/or digital, corresponding to the light received from fiber 18.

In the absence of any distortion of surface 14a or change in depth of the cell an ambient signal is provided by processor 22. However, when an object, such as object 16, comes into contact with membrane surface 14b (See FIG. 1B) the surface 14b gets distorted, causing a corresponding or related distortion in surface 14a.

As a result, the amount of light which gets reflected to fiber 18 changes, thereby changing the amount of light received by processor 22. Consequently, the signal, provided thereby, differs from the ambient signal. The fact that the signal differs from the ambient signal and-/or the amount of change are easily determinable in the processor with comparators or similar devices. Thus, the processor is capable of providing an indication of contact of the cell with an object when a difference from the ambient signal by more than a selected amount (to account for raise) is sensed. Also, the magnitude of the difference is indicative of the pressure forces applied to the membrane.

Figure 1B:
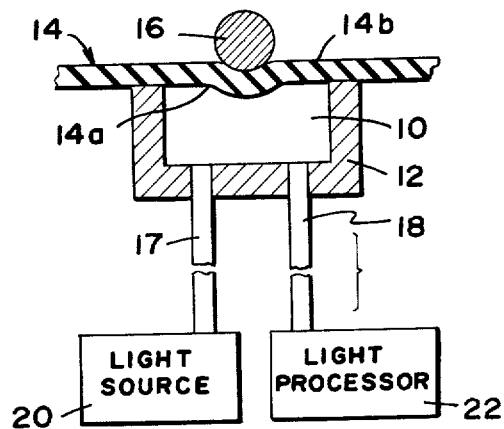
Figure 1C:
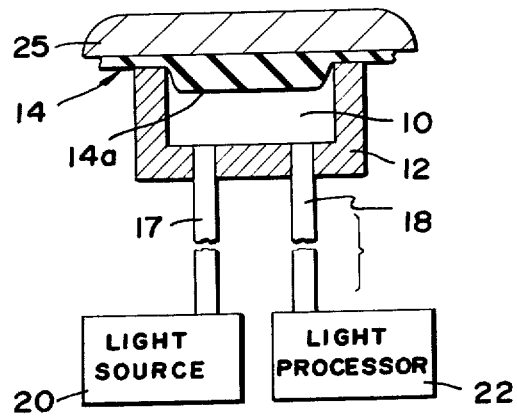

In FIG. 1B it is assumed that object 16, as a result of the pressure which it applies to membrane 14, only distorts surface 14a. In FIG. 1C an object 25 is shown. Its contact surface is assumed to be greater than the cross-sectional area of the cell, and, therefore, its pressure on the membrane results in a reduced cell height.

From the foregoing it should be appreciated that there are several significant advantages to a tactile sensor using a cell, as herebefore described. The membrane is an elastic material and preferably electrically unconductive e.g. rubber or any rubber like material. Thus, any object whose contact is to be sensed, such as objects 16 and 25, comes in contact with an electrically non-conductive surface. Also, touch i.e. tactile, and pressure forces are sensed by changes in light, rather than by electrical sensors at the point of touch. Light is immune to various sources of noise, such as electrical and/or magnetic fields. Therefore the light can be passed through such fields undisturbed, which is not the case for electrical signals. Consequently, the cell of the present invention can be used with great advantage over electrical type tactile sensors, whenever the sensing has to take place in one location and the processing in another remote location and the passing between these locations may involve the traversing of electrical and-/or magnetic fields.

One application in which the present invention can be utilized with great advantage is in connection with mechanical hands which are manipulated by an operator to perform various functions, such as gripping, moving, and/or rotating various objects. In performing these functions it is often very important to know when the hand comes in contact with an object and the pressure forces which are applied to the object. FIG. 2 to which reference is made is a simplified diagram of a mechanical hand 30. Its outer surface, which is to come in contact with any object, is covered by membrane 14, which together with the underlying solid member 12 forms a plurality of cells 10. In FIG. 2, separate pairs of fibers 17 and 18 are shown reaching each cell. In practice cells are formed on the hand wherever contact with an object and/or the pressure forces applied thereto is to be sensed. By producing at the expected contact surface an array of cells and by processing the reflected light from them, a tactile pattern and/or a pressure force pattern can be obtained.

The production of a cell array is especially facilitated in the present invention since optical fibers lend themselves to integration with present day circuit integration and miniaturization techniques. Since the cross-sectional areas of optical fibers are very small, one can design an array of cells of the present invention with many cells per unit area, yet terminate the ends of two fibers in each cell. An array with cells on the order of square mm each, was actually reduced to practice, with about 50 cells per square inch. With an array with a large number of cells per unit area, high resolution of the tactile pattern or of the pressure forces pattern is achievable.

A top view (with the membrane 14 removed) of an array of sixteen cells is shown in FIG. 3. As seen therein, the ends of fibers 17 and 18 terminate in each cell.

It should be appreciated that regardless of the array pattern light must be conducted to each cell and the light output therefrom must be processed. If desired and where feasible a separate fiber may be used to conduct light to each cell from a single light source and a separate fiber may be used to conduct light from each cell to the light processor. The latter may then be operated to sequentially process the light received from each cell and compare it with the cell's ambient signal. However, in some applications, such an arrangement may be either undesirable or unfeasible. In such cases it is preferable to reduce the number of fibers extending from the light source and the processor to the array.

In accordance with one aspect of the present invention the number of fibers extending to the array from the light source and the number of fibers from the array to the processor is greatly reduced. This aspect may best be explained in connection with FIG. 4 wherein an array of nine cells is diagrammed. The number of cells is limited to nine, for explanatory purposes only. The cells are shown arranged in three rows designated A, B and C and three columns numbered 1, 2, and 3. Each cell is represented by a block, designated by the letter C with subscripts corresponding to the row and column in which the cell is located. In the embodiment shown in FIG. 4, three light sources $L_A$, $L_B$ and $L_C$ are shown, with their subscripts designating the rows of cells serviced by them.

Light from source $L_A$ is conducted to the cells in row A, through a single fiber $17_A$. Once in the array the single fiber 17A is connected to each cell in row A through a short fiber section 17X, which serves as a light branch, between the fiber $17_A$ and the cell. Likewise, single fiber $17_B$ connects source $L_B$ to the cells in row B, and single fiber $17_C$ connects source $L_C$ to the cells in row C.

Figure 4:
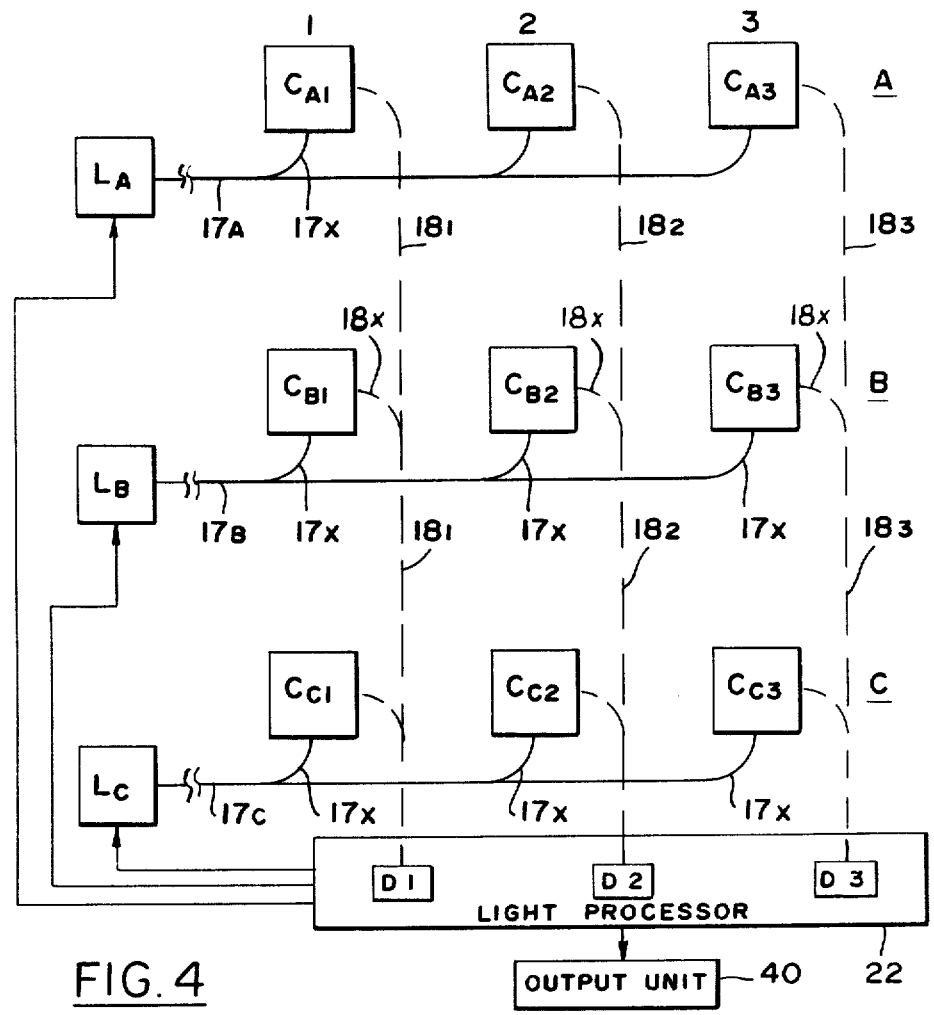
FIG. 4 is a block diagram of an example of a cell array with fiber optics.

As to the connections between the array and the light processor 22, instead of three separate fibers 18 for the cells on column 1, a single fiber $18_1$, connects these cells through light branches 18x to the processor. Likewise, single fibers $18_2$ and $18_3$ together with branches 18x connect the processor 22 to the cells in columns 2 and 3, respectively. Preferably as shown in FIG. 4 the processor includes a separate light sensing device or detector for each column of cells. The three detectors for the three column array are designated by $D_1$, $D_2$ and $D_3$. The fiber from each column is supplied to its respective detector.

It is thus seen that for the 3×3 array of cells, shown in FIG. 4, instead of nine separate fibers, entering the array to provide light to each of the cells, the number of fibers is reduced to the number of rows, three in the particular example. Also instead of nine separate fibers exiting the array, so as to conduct light to the processor, the number of fibers is reduced to the number of columns. Thus instead of 9×2=18 fibers from the array to the external circuitry the number has been reduced to 3+3=6. The reduction becomes much more significant as the array size increases. For example, in a 10×10 array of 100 cells instead of 200 fibers, only 20 fibers extend from the array. With presently known circuit integration techniques, it is possible to fabricate the fibers and the light branches in a single plane without any cross-talk between the various fibers.

As shown in FIG. 4, the processor is connected to each of the light sources. To process the outputs of the cells in the array the processor may turn on one of the sources e.g. $L_A$ and thereafter it may sequentially process the outputs of the cells in row A sequentially processing the light received by the three detectors of the processor via fibers $18_1 18_2$ and $18_3$. Once the cells in row A are processed, source $L_A$ is deactivated and source $L_B$ is activated, and the sequential processing of the cells in row B takes place, followed by turning $L_B$ off, turning $L_C$ on and processing the cells in row C. If desired, the outputs of the cells in each column may be processed sequentially by sequentially activating the three sources for processing the outputs of the cells in each column.

The results of processing the light received from each cell, with respect to the cell's ambient signal, which is assumed to be stored in the processor, may be transferred to an output unit 40 in analog and/or digital form. The output unit may include a memory, a visual display, a printout device or any combination thereof. Thus, the results may be provided as a printout, or they may be displayed. The display may take place as the processing takes place. Alternatively, the results may be stored in the memory and retrieved therefrom either at the end of the processing or whenever a display is desired.

It should be pointed out that the arrangement shown in FIG. 4 and the preceding description thereof having been presented for explanatory purposes only, to highlight the advantages of the tactile sensor of the present invention which includes optical fibers to conduct light to and from the sensor's cells. Other arrangements of fiber connections between one or more light sources and the processor and the cells may be employed without departing from the spirit of the invention.

For example, in FIG. 4, instead of a single fiber, such as 17A extending to each row of cells which necessitates the inclusion of light branches, such as 17X which may be short sections of fibers or light pipes, one can use a bundle of fibers from each light source, each fiber terminating at another cell in the row. Also, instead of one fiber per column a bundle of fibers can be used with a separate light detector in processor 22 responding to light from the fibers coming from a different column. One significance of the arrangement in FIG. 4 is in the use of one light source per row and one detector per column to enable the sequential processing of the light signals from the various cells, and their independent identification by the electronic means in the processor 22. As to the processor, its functions have been clearly described. Its implementation is clearly within the state of the art.

Figure 6:
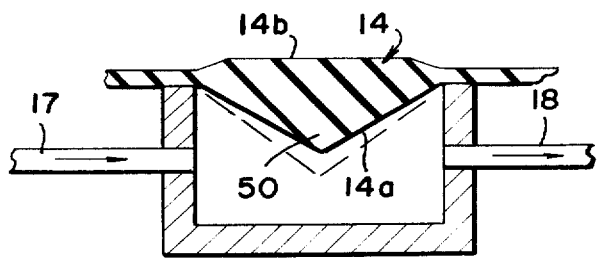
FIG. 6 is a side cross-sectional view of another cell embodiment.

It should also be pointed out that although the sensor has been described in connection with a mechanical hand it is not intended to be limited thereto. It can be used wherever a tactile and or pressure forces are to be sensed. It is particularly advantageous wherever signal fidelty may be affected by external electrical and/or magnetic disturbances. Also, since the sensor can be fabricated with densely spaced cells, it can be used to great advantage whenever high pattern resolution is required. Furthermore, since the membrane with its contact surface 14b are electrically non-conductive, the sensor can be used, wherever such characteristics are desired. For example, it may be used in medical application to sense body swelling and the extent thereof at areas of concern. If desired, the sensor may be used to form an alpha-numeric keyboard. For such an application an egg-crate type matrix of cells, shaped to correspond to the keyboard dimensions may be formed, with one cell per key. The outer surface 14b of the membrane may be marked by letters and/or numerals as shown in FIG. 5. Any key may be activated by simply depressing the membrane thereat. Such depression will result in a change in the light conducted from the cell from the ambient light, thereby enabling the processor to provide an indication that the key was activated. It should be pointed out that the cell arrangement shown in FIG. 1A in which the two fibers terminate in the cell at a side opposite the top elastic surface 14a, represents but one cell arrangement. If desired, a cell arrangement as shown in FIG. 6 may be employed. Therein the light is conducted into the cell through one side wall and is conducted out of the cell through an opposite side. The membrane 14 is designed to have a cone like shape. So, in the absence of contact, the cone is not in the light path. However as pressure is applied to the membrane 14 the cone tip moves downwardly thereby blocking part or all of the light which enters the cell from exiting the cell.

Figure 7:
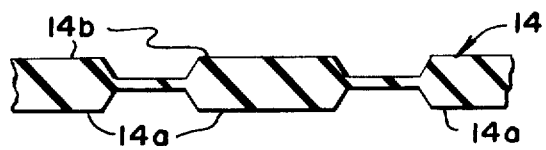
FIG. 7 is a side view of a preferred membrane.

Herebefore the membrane 14 is generally shown as being of uniform thickness. It may be preferrable to design it so that between cells the thickness of the membrane is less than over the cells as shown in a side view of the membrane 14 in FIG. 7. With such a membrane, less crosstalk between cells would result.

Although particular embodiments of the invention have been described and illustrated herein, it is recognized that modifications and variations may readily occur to those skilled in the art and consequently, it is intended that the claims be interpreted to cover such modifications and equivalents.

What is claimed is:
1. A tactile sensor comprising:
structure means including elastic means, and defining an array of a plurality of enclosed cells, each cell including a top side, defined by a surface area of a first surface of said elastic means, the latter having a second surface, opposite said first surface, said second surface being exposed and adapted to come in contact with an object whereby the height of a cell is affected by depression of said elastic means;
light source means;
first light conducting means connected to said light source means and terminating at each of said cells for conducting light into each cell;
light processing means; and
second light conducting means spaced apart from said first light conducting means and connected to said light processing means and terminating at each of said cells for conducting light from each cell to said light processing means.
2. The sensor described in claim 1 wherein:
said structure means includes an elastic membrane forming said elastic means, and a solid material forming a plurality of cavities covered by said elastic membrane.
3. The sensor described in claim 1 wherein:
said array of cells is arranged in X rows and Y columns;

said light source means includes X light source each associated with one of said rows and said light conducting means is constructed to carry light from one of said light sources to all cells of a row at the same time; and said light processing means includes Y light detectors, and said second light conducting means is constructed to carry light from all cells of a column at the same time to one of said light detectors.

* * * * *